United States Patent [19]
Van Vaals et al.

[11] Patent Number: 6,064,206
[45] Date of Patent: May 16, 2000

[54] METHOD OF AND DEVICE FOR DETERMINING A TEMPERATURE DISTRIBUTION IN AN OBJECT BY MEANS OF MAGNETIC RESONANCE

[75] Inventors: Johannes J. Van Vaals; Jouke Smink, both of Eindhoven, Netherlands

[73] Assignee: U.S. Philips Corporation, New York, N.Y.

[21] Appl. No.: 09/173,215

[22] Filed: Oct. 15, 1998

[30] Foreign Application Priority Data

Oct. 16, 1997 [EP] European Pat. Off. .............. 97203210

[51] Int. Cl.[7] ....................................... G01V 3/00
[52] U.S. Cl. ......................... 324/312; 324/318; 324/322; 324/309; 128/653; 128/653.2
[58] Field of Search ..................... 324/312, 318, 324/322, 309, 307, 306; 128/653, 653.2, 736, 653.3, 653.4

[56] References Cited

U.S. PATENT DOCUMENTS

| 4,937,526 | 6/1990 | Ehman et al. | 324/309 |
| 5,151,656 | 9/1992 | Maier et al. | 324/309 |
| 5,263,482 | 11/1993 | Leunbach | 128/653.2 |
| 5,711,300 | 1/1998 | Schneider et al. | 128/653.2 |

FOREIGN PATENT DOCUMENTS

WO9616340  5/1996  WIPO ................ G01R 33/565

*Primary Examiner*—Christine Oda
*Assistant Examiner*—Brij B. Shrivastav
*Attorney, Agent, or Firm*—Dwight H. Renfrew

[57] ABSTRACT

The invention relates to a method of determining, utilizing magnetic resonance, a temperature distribution of a part of an object which is arranged in a substantially uniform steady magnetic field, the determination of the temperature distribution involving the determination of a reference image of the object, for example a part of the human body, and a phase image of the human body. Subsequently, the temperature distribution is determined from phase differences between the values of pixels of the phase image and the values of corresponding pixels of a predetermined reference phase image. In order to counteract errors in the temperature distribution which are caused by motion of the object, navigator pulse sequences are generated so as to measure navigator signals prior to the measurement of MR signals wherefrom the reference image and the phase image are reconstructed. Subsequently, a correction for correction of the temperature distribution is derived from the navigator signals.

14 Claims, 3 Drawing Sheets

METHOD OF AND DEVICE FOR DETERMINING A TEMPERATURE DISTRIBUTION IN AN OBJECT BY MEANS OF MAGNETIC RESONANCE

BACKGROUND OF THE INVENTION

1. Field of the Invention

The invention relates to a method of determining a temperature distribution of a part of an object, arranged in a substantially uniform, steady magnetic field, by means of magnetic resonance, which method includes the following steps: excitation of spins in the part and measurement of MR signals, containing location-dependent information of the excited spins, by means of MR imaging pulse sequences, determination of a phase image of the part from the measured MR signals, determination of a temperature distribution of the part from phase differences between the values of pixels of the phase image and the values of corresponding pixels of a predetermined reference phase image. The invention also relates to a device for carrying out such a method.

2. Description of Related Art

In the context of the present patent application a k-space is to be understood to mean a spatial frequency domain in which a path is traveled during the measurement of the MR signals by application of gradients to the steady magnetic field. The path in the k-space is determined by the time integral of the gradients applied during the interval between the excitation of the spins until the instant in time at which the MR signal is measured. The measured values of the MR signals corresponding to the most important part of the path or paths yield the inverse Fourier transformed values of an image of the object. Furthermore, gradients are to be understood to mean temporary magnetic fields which are superposed on a steady magnetic field and cause a gradient in the steady magnetic field in three respective orthogonal directions. Generally speaking, a gradient in the first direction is referred to as a read-out gradient, a gradient in the second direction as a phase encoding gradient and a gradient in the third direction as a selection gradient. Furthermore, a navigator gradient is to be understood to mean a gradient which is applied during the measurement of the navigator signal; a direction of the navigator gradient is referred to as the measuring direction.

A method of this kind is known from international patent application WO 25 94/23308. The known method is used, for example to determine a temperature distribution in a part of the human body. Such a part is, for example, a slice of the body which contains a tumor to be destroyed, said tumor being heated to a temperature beyond a limit temperature. In order to minimize the damage to other tissue of the body, it is necessary to have an accurate temperature distribution of the part available before and during the heating. This temperature distribution is formed by execution of the known method. For example, an ultrasonic source can be used to heat the tumor, the sound waves to be generated are then focused onto the part to be heated. In order to determine the temperature distribution of the part at a number of successive instants during the heating of the tumor, the reference phase image of the part to be heated is determined prior to the heating of the tumor, after which the MR signals of the part to be heated are measured by means of the MR imaging pulse sequences at the given instants during the heating. Subsequently, the phase image is reconstructed from the measured MR signals. The temperature distribution of the part to be heated is derived from the phase differences between the values of corresponding pixels of the reference phase image and the phase image. Subsequently, information derived from the temperature distribution obtained can be used to control the heating process, for example by determining the position of the heated location in the part from the temperature distribution.

It is a drawback of the known method that the temperature distribution contains errors which are caused by movement of the part of the body whose temperature distribution has been determined.

SUMMARY OF THE INVENTION

It is an object of the invention to reduce the errors in the temperature distribution which are caused by movement of the part of the body in the steady magnetic field. To this end, the method according to the invention is characterized in that it also includes the following steps: excitation of spins in a first reference part of the object, a motion of which is related to a motion of the part, and measurement of a navigator signal by means of a first navigator pulse sequence, and determination of a shift in a measuring direction of the first navigator pulse sequence from the measured navigator signal and a predetermined reference so as to determine a correction for correcting the temperature distribution. The invention is based on the idea that the movement of the object may cause different errors which contribute to the phase differences between corresponding pixels of the reference phase image and the phase image, the temperature distribution being determined from said phase differences. Analysis of the navigator signals, for which a modulus as well as a phase of the navigator signals are available, can produce information concerning the motion of the part to be heated or concerning other causes of errors in the temperature distribution, for example inhomogeneities of the steady magnetic field which are due to the presence of other parts of the object, such as a shoulder of the human body which is present in the steady magnetic field. Subsequently, the information obtained is used to apply a correction to the temperature distrubution, for example a correction prior to or during the measurement of the MR signals or retrospectively, in which case the correction is applied to the temperature distribution at a later stage.

Navigator signals are known per se from U.S. Pat. No. 4,937,526. However, according to the method disclosed in the cited patent a motion correction is determined by means of navigator signals which are not measured independently of the MR signals for reconstructing an MR image. The navigator signals are also known from the international patent application WO-A-96116340; however, the method disclosed in the latter patent application is used to determine a correction for MR images which is derived by means of navigator signals measured in a reference part whose motion is related to the part whose temperature distribution is determined. The correction known from the latter patent application, however, does not relate to the correction of phases of temperature images.

A special version of the method according to the invention is characterized in that the method includes a step in which the correction is applied to the MR signals used to reconstruct the phase image in order to correct these signals for a shift of the slice. Thus, for example a correction can be made for frequency and phase errors which are dependent on the position of the part within the body and are caused by a temporally varying deviation in the steady magnetic field which is caused by a change of susceptibility in the object, for example a tissue transition such as the liver-lung transition in the human body. This correction can be made prior to or during the measurement of the MR signals.

A further version of the method according to the invention is characterized in that the measuring direction corresponds to a direction transversely to the slice, a frequency content of an excitation RF pulse of an MR imaging pulse sequence succeeding the first navigator pulse sequence being corrected for the shift of the slice. As a result of this step, the spins of the part whose temperature is to be determined are excited in the shifted position.

A further version of the method according to the invention is characterized in that the measuring direction corresponds to a direction of a read-out gradient of an MR imaging pulse sequence for measuring the MR signals, a frequency correction being applied to the MR signals during the measurement of the MR signals, said frequency correction being related to the shift of the slice. As a result of this step, the frequencies of the MR signals originating from the voxels in the shifted slice are corrected in such a manner that the frequencies of the MR signals of the corresponding positions correspond to the position of the voxels of the slice in a reference position.

A further version of the method according to the invention is characterized in that the measuring direction corresponds to a direction of a phase encoding gradient of an MR imaging pulse sequence, a phase correction of the MR signals being applied during the measurement of the MR signals, said phase correction being related to the shift of the slice. As a result of this step, the phase of the MR signals originating from the voxels in the slice in the shifted position are corrected so that the phase of the MR signals of the corresponding positions corresponds to the positions of the voxels in the reference position.

A further version of the method according to the invention is characterized in that the method includes a step in which the correction also includes a phase correction of a pixel of the temperature distribution of the slice in a first position, said phase correction being determined by a phase difference between a first measuring point of the reference, which corresponds to the first position, and a second measuring point of the navigator signal which corresponds to a second position of the part, said second position having been shifted in the measuring direction relative to the first position. Thus, a correction is made for a phase error which is caused by a temporally fixed deviation in the steady magnetic field which is caused by another, non-moving part of the body, for example a shoulder, or is caused by a permanent inhomogeneity within the steady magnetic field, as opposed to the previously mentioned phase errors which are dependent on the position of the part within the body and are caused by a temporally varying deviation in the steady magnetic field.

A further version of the method according to the invention is characterized in that a cylindrical part is chosen as the first reference part. As a result, 2 DHF pulses can be used to generate navigator signals. The 2 DHF pulses are known from the article "A k-space analysis of small tip angle excitation", by J. Pauli et al, published in Journal of Magnetic Resonance 1989, No. 81, pp. 43–56.

A further version of the method according to the invention is characterized in that for the reference a reference navigator signal is generated by means of a second navigator pulse sequence in the first reference part.

A further version of the method according to the invention is characterized in that the method includes a step for further homogenization of the substantially uniform steady magnetic field in the part of the object to be imaged. This step enables a reduction of phase errors due to local deviations in the magnetic field which are caused by the presence of the object.

The invention also relates to an MR device for measuring a temperature distribution of a part of an object, characterized in that the control means are also arranged to measure, using a navigator pulse sequence, a navigator signal in a reference part of an object to be arranged in the MR device, a motion of said reference part being related to the part of the object whose temperature distribution is determined, and that the processing unit is also arranged to determine a shift in a measuring direction of the navigator pulse sequence from the measured navigator signal and a predetermined reference, and to determine a correction from the shift so as to correct the temperature distribution.

BRIEF DESCRIPTION OF THE DRAWING

The above and other, more detailed aspects of the invention will be described in detail hereinafter, by way of example, with reference to the drawing.

In the drawing.

DETAILED DESCRIPTION OF THE PREFERRED EMBODIMENT

Figure 1:
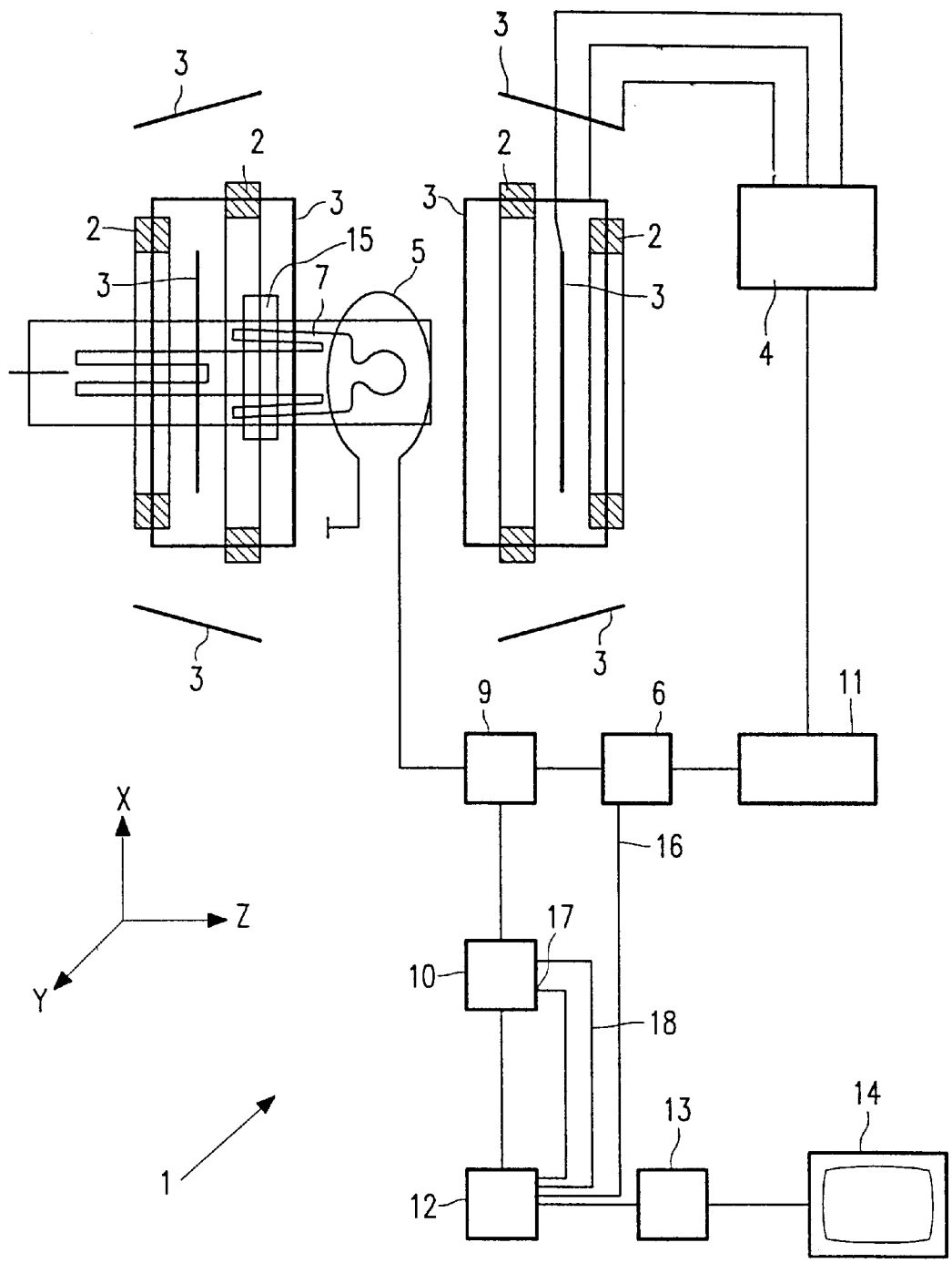
FIG. 1 shows an MR device which includes an ultrasonic source.

FIG. 1 shows a magnetic resonance device. The magnetic resonance device includes a first magnet system 2, a second magnet system 3, a power supply unit 4, an RF transmitter and modulator 6, an RF transmitter coil 5, a transmitter-receiver circuit 9, a signal amplifier and demodulation unit 10, a processing unit 12, an image processing unit 13, a monitor 14 and a control unit 11. The first magnet system 2 serves to generate a steady magnetic field. The various gradient coils of the second magnet system 3 serve to generate additional magnetic fields having a gradient in the X, Y, Z directions, respectively. The Z direction of the co-ordinate system shown in FIG. 1 corresponds by convention to the direction of the steady magnetic field in the magnet system 2. The measuring co-ordinate system x, y, z to be used may be chosen independently of the X, Y, Z system shown in FIG. 1. In the context of the present application gradients are to be understood to mean temporary magnetic fields which are superposed on a steady magnetic field and cause a gradient in the steady magnetic field in three respective orthogonal directions. Generally speaking, a gradient in the first direction is referred to as a read-out gradient, a gradient in the second direction as a phase encoding gradient, and a gradient in the third direction as a selection gradient.

The gradient coils 3 are fed by the power supply unit 4. The RF transmitter coil 5 serves to generate RF magnetic fields and is connected to the RF transmitter and modulator 6. A receiver coil is used to receive the magnetic resonance signal generated by the RF field in the object 7 to be examined, for example a human or animal body. This coil may be the same coil as the RF transmitter coil 5. The magnet system 2 encloses an examination space which is large enough to accommodate a part of the body 7 to be examined. The RF transmitter coil 5 is arranged around or on a part of the body 7 within the examination space. The RF transmitter coil 5 is connected to the signal amplifier and demodulation unit 10 via the transmitter-receiver circuit 9. The control unit 11 controls the RF transmitter and modulator 6 and the power supply unit 4 so as to generate special pulse sequences which contain RF pulses and gradients. The MR signals received by means of the receiver coil 5 are applied, via the transmitter-receiver circuit 9, to the signal amplifier and demodulation unit 10. The phase and amplitude provided by the signal amplifier and demodulation unit 10 are applied to the processing unit 12. The processing unit 12 processes the applied phases and amplitudes, by way of a transformation, to an image of the part of the body. Via the image processing unit 13, the image can be visualized on the monitor 14. The MR device also includes an ultrasonic source 15 for heating the part of the body to be treated, for example a tumor in the liver.

The invention will be described in detail hereinafter, by way of example, on the basis of an MR method which utilizes an MR imaging pulse sequence, for example a gradient echo pulse sequence, for measuring MR signals of a part of the body containing a zone to be heated, for example a slice in the liver which contains the tumor, the zone to be heated in the slice being adjusted in such a manner that it coincides with a part of the tumor. The gradient echo pulse sequence is known inter alia from "Practical NMR imaging", by M. A. Foster and J. M. S. Hutchison, 1987, IRL Press.

Figure 2:
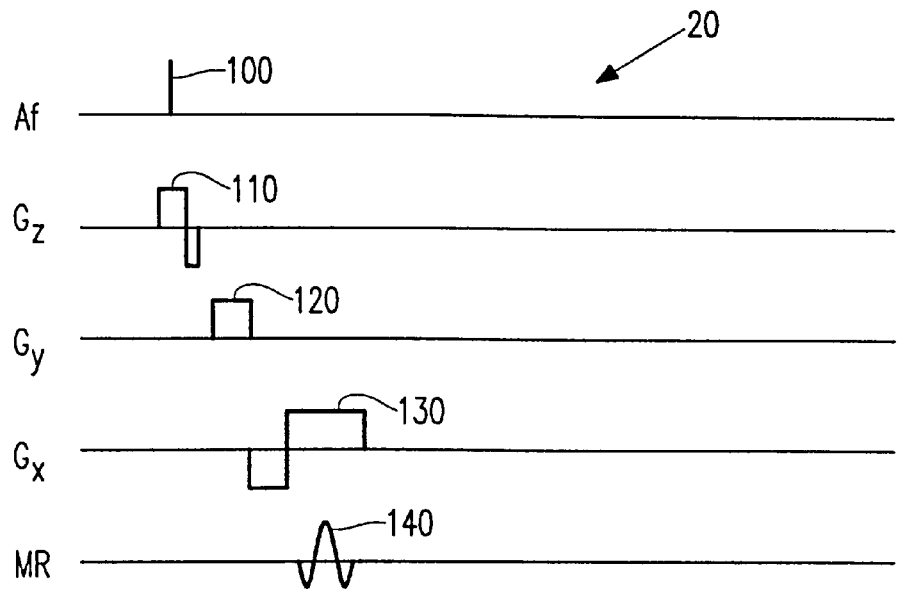
FIG. 2 shows a gradient echo pulse sequence.

FIG. 2 shows the known gradient echo pulse sequence. The gradient echo pulse sequence 20 includes an excitation RF pulse 100 and temporary magnetic gradient fields. The gradient echo pulse sequence commences with the application of an excitation RF pulse 100, having a flip angle α, and a selection gradient 110 for exciting the spins within the part of the body 7. The flip angle α amounts to, for example 30°. The selection gradient 110 is oriented in the z direction. After the slice selection, a phase encoding gradient 120 and a read-out gradient 130 are applied successively, an MR signal 140 being measured during the application of the read-out gradient. The gradient echo pulse sequence 20 is repeated for different values of the phase encoding gradients $G_y$ so as to measure a complete set of MR signals which relate to, for example 256 lines which are uniformly distributed in the k-space.

In order to enable a temperature distribution of the slice of the body to be followed in time, a reference image is formed prior to inducing a temperature variation in the zone to be heated, after which a phase image is determined at predetermined instants. In order to determine the reference image, MR signals 140 of the slice are measured by means of said gradient echo pulse sequences 20. Subsequently, the reference phase image is determined from the measured MR signals by means of a two-dimensional Fourier transformation. Subsequently, a temperature variation is induced in the slice.

In order to determine the phase image at one of the predetermined instants during or after the heating, for example 256 MR signals 140, originating from the slice to be imaged, are measured by means of 256 successive gradient echo pulse sequences 20. The phase image is determined from these MR signals by means of two-dimensional Fourier transformation. The temperature distribution of the slice imaged is derived from the phase differences between the values of corresponding pixels of the predetermined reference phase image and the phase image. Subsequently, the temperature distribution obtained can be visualized on the monitor 14 and used, for example to control the heating process. This is done, for example, to adapt the dimensions of the zone to be heated in the liver. This method is known from the cited WO 94/23308.

The temperature variation can be realized, for example by heating the zone to be heated by generating ultrasonic waves by means of an ultrasonic source 15 and by concentrating these waves on the part of the liver to be heated. Another possibility is to apply light to the zone to be heated, the light being generated by a light source (not shown) and being conducted to the zone to be heated via an optical conductor to be introduced into the body (not shown). It is also to be noted that a temperature variation can also be realized by cooling the part of the body by means of cryo-ablation. Cryo-ablation is known from the article "Hepatic Cryosurgery with Intraoperative U.S. Guidance", published by F. T. Lee et al. in Radiology No. 202, 1997, pp. 624–632.

Figure 3:
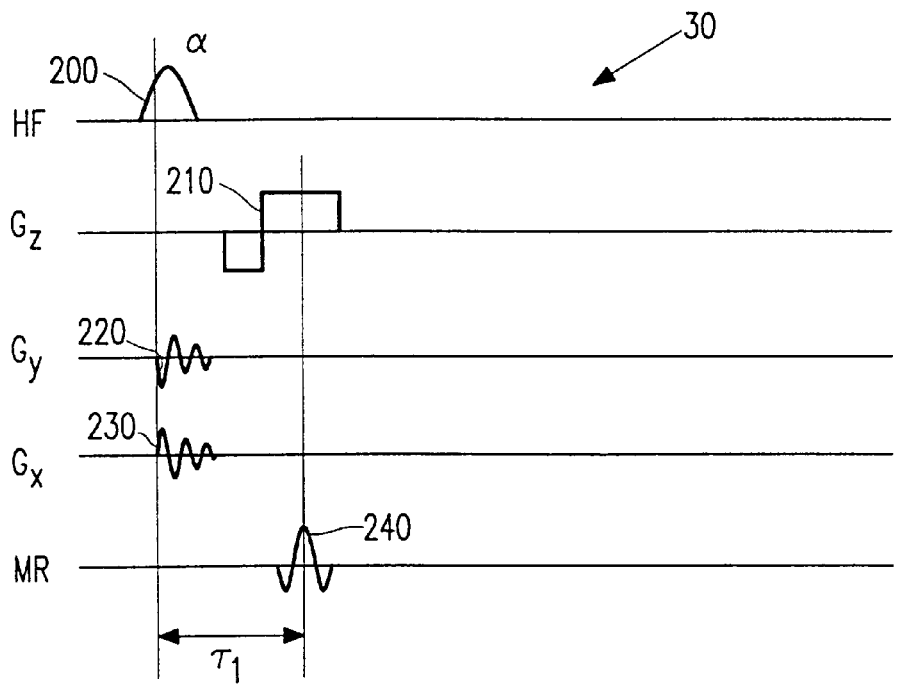
FIG. 3 shows a navigator pulse sequence for generating a navigator MR signal.

In order to counteract deviations in the temperature distribution due to a motion of the body in, for example the z direction, the method according to the invention includes the measurement of navigator signals from a reference part by generating a navigator pulse sequence prior to the gradient echo pulse sequences 20, the reference part being chosen in such manner that the motion of the reference part is related to the part to be heated. FIG. 3 shows an example of a navigator pulse sequence.

FIG. 3 shows a navigator pulse sequence 30. The navigator pulse sequence 30 includes a two-dimensional (2D) RF pulse or a three-dimensional (3D) RF pulse for the excitation of spins in a cylindrical reference part, for example a first pencil-shaped reference part, and a read-out gradient. The 2D-RF pulse includes an excitation RF pulse 200 which has a flip angle $\alpha_{nav}$. A practical value used for $\alpha_{nav}$ is, for example 10°. The selective excitation of the first pencil-shaped reference part 40 is achieved by means of a first gradient 220 and a second gradient 230 which are oriented perpendicularly to a direction of motion. In FIG. 3 the first and the second gradient are oriented in the x direction and the y direction, respectively. A 3D-RF pulse can be used instead of a 2D-RF pulse. The 2D-RF pulse and the 3D-RF pulse are known from the previously cited article "A k-space analysis of small tip angle excitation", by J. Pauli et al., published in Journal of Magnetic Resonance 1989, No. 81, pp. 43–56. Using a third gradient 210, the spins are dephased and rephased so that an in-phase state is reached and a navigator signal 240 is measured a period of time $\tau_1$ after the excitation RF pulse 200. Frequency modulation of the navigator signal 240 is achieved by sustaining the third gradient. The third gradient 210 of the navigator pulse sequence 30 is oriented in a direction of motion of the first reference part 41 and will be referred to hereinafter as the navigator gradient. The direction of the navigator gradient is referred to as the measuring direction. In this example the measuring direction coincides with the z direction. Furthermore, the pencil-shaped reference part of the body 7 is chosen in such a manner that it contains a part of a lung and a part of the diaphragm of the body 7. A first version of the method will be described in detail hereinafter with reference to FIG. 4.

Figure 4:
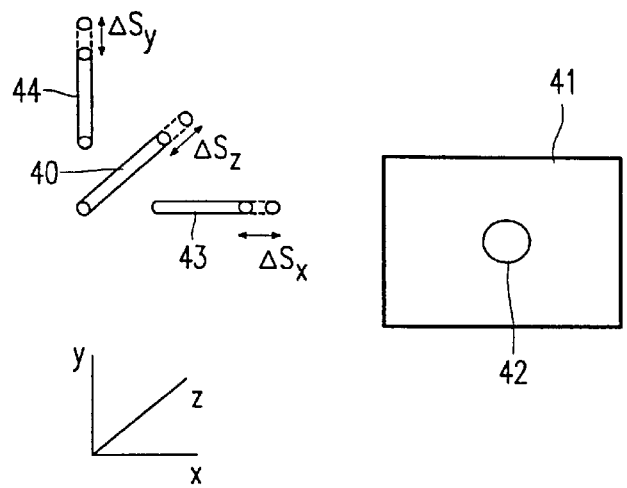
FIG. 4 shows a pencil-shaped reference part and the slice for which a temperature distribution is to be determined.

FIG. 4 shows the first pencil-shaped reference part 40 and a slice whose temperature distribution is to be determined. An example of such a slice is a slice 41 of the liver in which a tumor 42 is located. In FIG. 4 the first reference part 40 is oriented in the z direction and the slice 41 extends substantially perpendicularly to the z direction. The reference part 40 may be, for example pencil-shaped. In order to acquire motion information from the slice, for example a first navigator signal of the first reference part is measured by generating a first navigator pulse sequence prior to a gradient echo pulse sequence which is generated so as to measure the MR signal which is used for the reconstruction of the reference image, and a second navigator signal of the first reference part by generating a second navigator pulse sequence prior to a gradient echo pulse sequence which is generated so as to measure an MR signal which is used for the reconstruction of the phase image. This combination of navigator pulse sequences and gradient echo pulse sequences will be described in detail with reference to FIG. 5.

Figure 5:
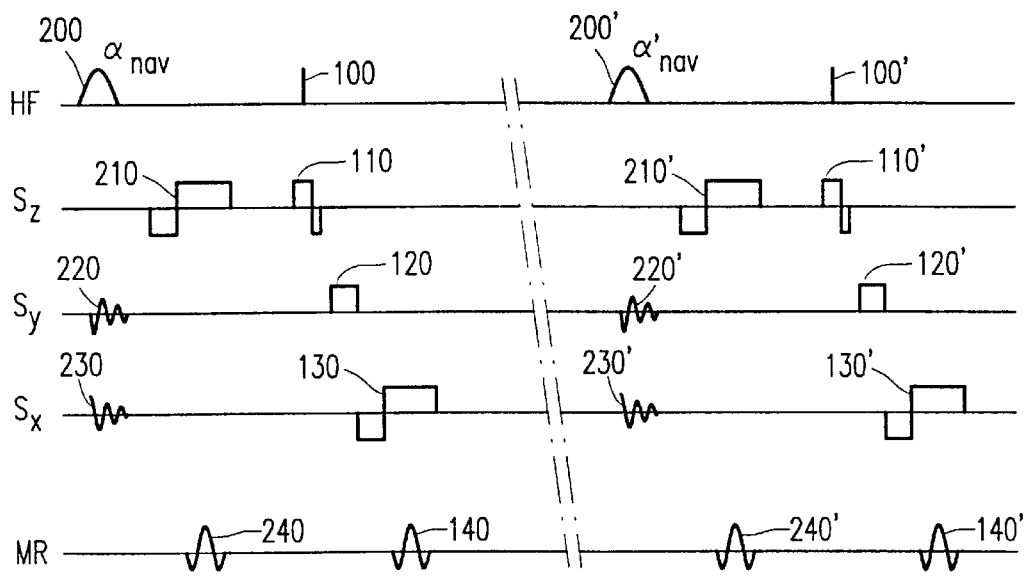
FIG. 5 shows a combination of a navigator pulse sequence and a gradient echo pulse sequence.

FIG. 5 shows an example of successive navigator pulse sequences 30 and gradient echo pulse sequences 20, the first navigator pulse sequence 30 commencing with the first 2D RF pulse 200, succeeded by a first plurality of gradient echo pulse sequences, for example 256, only one of which is shown in FIG. 5 for the sake of simplicity; this gradient echo pulse sequence commences with the first RF pulse 100. FIG. 5 also shows a second navigator pulse sequence 200' which commences with a second 2D-RF pulse 200' and a second plurality of gradient echo pulse sequences, again 256, only one of which is shown in FIG. 5; this gradient echo pulse sequence commences with a second RF pulse 100'. Furthermore, the measuring direction of the first and second navigator pulse sequences 200, 200' corresponds to the z direction. The first and second navigator signals $z_{nav1}$, $z_{nav2}$ 240, 240', generated by the first and second navigator pulse sequences 200, 200', are subsequently measured and sampled.

Subsequently, the processing unit 12 determines a shift $\delta_z$ of the slice in the z direction from the measured first navigator signal $z_{nav1}$ 240 and the second navigator signal $z_{nav2}$ 240' by successively applying a known edge detection algorithm. A further possibility for determining the shift of the reference part 40 consists in determining a correlation between the measured first navigator signal $z_{nav1}$ 240 and second navigator signal $z_{nav2}$ 240' by application of a known correlation algorithm. The edge detection algorithm and the correlation algorithm are known from the article "Algorithms for extracting motion from navigator echoes" published by Y. Wang et al., in, Diagnostic Radiology, Vol. 36, 1996, pp. 117–123. A correction can be applied to the temperature distribution when the shift in the measuring direction is known.

In order to apply the correction to the temperature distribution, according to the first version of the invention the processing unit 12 derives a first motion correction signal 16 from the shift $\delta s_z$ determined, a value of the first motion correction signal 16 then corresponding to a frequency correction $$\delta f = \frac{\gamma \delta s_z G_z}{2\pi},$$

in which $\gamma$ represents the giro magnetic ratio, $\delta s_z$ represents the shift in the measuring direction, and $G_z$ represents the selection gradient of the gradient echo pulse sequence 20. The first motion correction signal 16 is applied to a modulation input of the RF modulator 6, so that the RF modulator adapts a frequency content of the second RF pulse 100' of a gradient echo pulse sequence succeeding the second navigator pulse sequence, so that the zone to be imaged coincides with the moving slice 41 in the body to be imaged, and the zone to be imaged in the steady magnetic field follows a motion of the slice 41 to be imaged in the body. Using this adjustment of the first motion correction signal 16, subsequently the 256 MR signals for the reconstruction of the phase image are measured. Subsequently, using a two-dimensional Fourier transformation, the processing unit 12 reconstructs the phase image of the part 41 and the temperature distribution from the difference between the predetermined reference image and the phase image. When the shift $\delta s_z$ exceeds a predetermined threshold value, it is also possible to abstain from generating gradient echo pulse sequences and to generate only the navigator pulse sequences until the shift $\delta s_z$ drops below the predetermined threshold value.

In order to determine a correction for a motion parallel to the slice 41 and in the direction of the read-out gradient 130 of the slice, use is made of a second version of the invention in which a third navigator signal $x_{nav1}$ of a second reference part 43, shown in FIG. 4, is measured by generating a third navigator pulse sequence prior to the gradient echo pulse sequences 20 which are generated so as to measure MR signals for the reconstruction of the reference image, and a fourth navigator signal $x_{nav2}$ of the second reference part by generating a fourth navigator pulse sequence prior to the gradient echo pulse sequences 20 which are generated so as to measure MR signals for the reconstruction of the phase image, the pencil-shaped second reference part 43 being chosen so as to extend parallel to the slice 41 to be imaged, and a second measuring direction of the third and the fourth navigator pulse sequence being oriented in the direction of the read-out gradient 130 of the gradient echo pulse sequence. Analogous to the method described above, the processing unit 12 subsequently determines a shift $\delta s_x$ in the direction of the read-out gradient from the third and the fourth navigator signal $x_{nav1}$, $x_{nav2}$. The processing unit 12 derives a second motion correction signal 17 from the shift $\delta s_x$, which signal is applied to the frequency correction input of the signal amplifier and demodulator unit 10 so that the signal amplifier and demodulator unit 10 performs the frequency correction upon reception of the MR signals 240'. The frequency correction is then given by $$\delta f = \frac{\gamma \cdot \delta s_x G_x}{2\pi},$$

in which $G_x$ represents the read-out gradient.

In order to determine a correction for a motion parallel to the slice 41 and in the direction of the phase encoding gradient, a third version of the invention is used in which a fifth navigator signal $y_{nav1}$ of a third reference part 44, shown in FIG. 4, is measured by generating a fifth navigator pulse sequence prior to the gradient echo pulse sequences 20 which are generated to measure MR signals for reconstructing the reference image, and a sixth navigator signal $y_{nav2}$ of the third reference part is measured by generating a sixth navigator pulse sequence prior to the gradient echo pulse sequences 20 which are generated to measure MR signals for reconstructing the phase image, the pencil-shaped third reference part 44 being chosen so as to extend parallel to the slice 41 to be imaged, a third measuring direction of the fifth and the sixth navigator pulse sequence being oriented in the direction of the phase encoding gradient. Analogously to the manner described before, the processing unit 12 subsequently determines a shift $\delta_y$ in the direction of the phase encoding gradient from the fifth and the sixth navigator signal $y_{nav1}$, $y_{nav2}$. The processing unit 12 derives a third motion correction signal 18 from the shift $\delta s_y$, which signal is applied to the phase correction input of the signal amplifier and demodulator unit 10, so that the signal amplifier and demodulator unit performs the phase correction upon reception of the MR signals 240. The phase correction is then determined by $$\delta\phi = \gamma \cdot \delta s_y \int \Delta G_y dt$$

where $\Delta G_y$ is a step size of the phase encoding gradient.

In order to determine a shift of the slice to a shifted position in the steady magnetic field, prior to the gradient echo pulse sequences for determining the phase image in the shifted position, the second, the fourth and the sixth navigator signal $z_{nav2}$, $x_{nav2}$, $y_{nav2}$ are measured by generating a second, a fourth and a sixth navigator pulse sequence in the three pencil-shaped reference zones 43, 44, 40, respectively, the first, the second and the third measuring direction of the navigator pulse sequences being oriented successively in the three orthogonal directions z, x, y, respectively. From the measured second, fourth and sixth navigator signals $z_{nav2}$, $x_{nav2}$, $y_{nav2}$ and previously measured navigator signals $z_{nav1}$, $x_{nav1}$, $y_{nav1}$ the processing unit 12 determines the three motion components $\delta s_x$, $\delta s_y$, $\delta s_z$ in the three orthogonal directions x, y, z, respectively, and subsequently generates the first, the second and the third motion correction signal 16, 17, 18, respectively, from the three motion components in the described manner.

A fourth version of the method according to the invention is used to determine a phase correction for the temperature distribution which provides a correction for a motion in the z direction and for a temporally constant deviation in the steady magnetic field which is caused by a magnetic field component. This constant deviation may be due to a part of the body which does not move relative to the steady magnetic field, for example a shoulder of the body. Another cause of said deviation is, for example an inhomogeneity of the steady magnetic field. In order to determine the latter phase correction, the processing unit 12 determines two phase sequences $\Phi_{nav1}(z)$, $\Phi_{nav2}(z)$, using a one-dimensional Fourier transformation, from the measured first and second navigator signals $z_{nav1}$, $z_{nav2}$ 240, 240'. These phase sequences contain the phase of the navigator signal as a function of the distance in the z direction along the first pencil-shaped reference part 40. The processing unit 12 subsequently performs a phase correction in conformity with the formula $\Phi'(x_i,y_j)=\Phi(x_i,y_j)+(\Phi_{nav1}(z_1)-\Phi_{nav2}(z_2))$, where $\Phi(x_i,y_j)$ represents the phase of a pixel $(x_i,y_j)$ of the temperature distribution, $\Phi'(x_i,y_j)$ represents the phase of a pixel $(x_i,y_j)$ of the corrected temperature distribution, $\Phi_{nav1}$ represents the phase sequence of the second navigator signal $z_{nav1}$ 240, and $\Phi_{nav2}$ represents the phase sequence of the second navigator signal $z_{nav2}$ 240', for all points $(x_i,y_j)$ of the temperature distribution of a slice in a position $z_1$ for a shift by $\delta s_z$ to a second position $z_2$ in the measuring direction. As a result of the correction applied to all pixels of the temperature distribution, the phase of a pixel $(x_i,y_j)$ of the temperature distribution of the slice 40 is corrected by the correction determined by a phase difference between a first measuring point of the first navigator signal $z_{nav1}$ 240, corresponding to the first position $z_1$ of a pixel of the slice, and a second measuring point of the navigator signal $z_{nav2}$ 240', corresponding to a second position $z_2$ of the voxel, said second position $z_2$ having been shifted in the first measuring direction relative to the first position. In this example the correction can also be achieved by determining a fourth motion correction signal from the phase correction and adding the fourth motion correction signal to the third motion correction signal 18.

In order to correct a phase variation due to a motion in an arbitrary direction as caused by temporally fixed deviations, use is made of a fifth version of the invention in which the processing unit 12 determines the phase sequences $\Phi x_{nav1}(x)$, $\Phi x_{nav2}(x)$, $\Phi y_{nav1}(y)$, $\Phi y_{nav2}(y)$, $\Phi z_{nav1}(z)$, $\Phi z_{nav2}(z)$ from the first to the sixth navigator signal $x_{nav1}$, $x_{nav2}$, $y_{nav1}$, $y_{nav2}$, $z_{nav1}$, $z_{nav2}$, where $\Phi x_{nav1}(x)$, $\Phi x_{nav1}(x)$ represent phases of the measured third and fourth navigator signals $x_{nav1}$, $x_{nav2}$ in a position x along the second pencil-shaped reference part 43, $\Phi y_{nav1}(y)$, $\Phi y_{nav1}(y)$ represent phases of the measured fifth and sixth navigator signals $y_{nav1}$, $y_{nav2}$ in a position y along the third pencil-shaped reference part 44, and $\Phi z_{nav1}(z)$, $\Phi z_{nav1}(z)$ represent phases of the measured first and second navigator signals $z_{nav1}$, $z_{nav2}$ in a position z along the first pencil-shaped reference part 40. The phase correction for a pixel $(x_i,y_j)$ of the temperature distribution of a slice in a first slice position $(x_1,y_1,z_1,)$ whereto the reference image corresponds for a shift to a second slice position $(x_1, y_1,z_1)$ whereto the phase image corresponds is then determined by $\Phi'(i,j)=\Phi(i,j)+(\Phi x_{nav1}(x_1)-\Phi x_{nav2}(x_2)+(\Phi y_{nav1}(y_1)-\Phi y_{nav2}(y_2))+(\Phi z_{nav1}(z_1)-\Phi z_{nav2}(z_2))$, where $\Phi'(i,j)$ represents the corrected phase of a pixel $(x_i,y_j)$ of the temperature distribution, $\Phi(i,j)$ represents the phase of a pixel $(x_i,y_j)$ of the temperature distribution, $\Phi x_{nav1}(x_1)$ represents the phase of the third navigator signal $x_{nav1}$ in the position $x_1$, $\Phi x_{nav2}(x_2)$ represents the phase of the fourth navigator signal $x_{nav2}$ in the position $x_2$, $\Phi y_{nav1}(y_1)$ represents the phase of the fifth navigator signal $y_{nav1}$ in the position $y_1$, $\Phi y_{nav2}(y_2)$ represents the phase of the sixth navigator signal $y_{nav2}$ in the position $y_2$, $\Phi z_{nav1}(z_1)$ represents the phase of the first navigator signal $z_{nav1}$ in the position $z_1$, and $\Phi z_{nav2}(z_2)$ represents the phase of the second navigator signal $z_{nav2}$ in the position $z_2$.

In order to achieve a further reduction of the phase errors in the temperature distribution, shimming of the steady magnetic field can be performed at the area of the slice whose temperature distribution is to be determined.

All references cited herein are incorporated herein by reference in their entirety and for all purposes to the same extent as if each individual publication or patent or patent application was specifically and individually indicated to be incorporated by reference in its entirety for all purposes.

What is claimed is:

1. A method of determining a temperature distribution of a part of an object, arranged in a substantially uniform steady magnetic field, by means of magnetic resonance, which method comprises the following steps:

excitation of spins in the part and measurement of MR signals, containing location-dependent information of the excited spins, by means of MR imaging pulse sequences, determination of a phase image of the part from the measured MR signals, determination of a temperature distribution of the part from phase differences between the values of pixels of the phase image and the values of corresponding pixels of a predetermined reference phase image, wherein the method also includes the following steps:

excitation of spins in a first reference part of the object, a motion of which is related to a motion of the part, and measurement of a navigator signal by means of a first navigator pulse sequence, and determination of a shift in a measuring direction of the first navigator pulse sequence from the measured navigator signal and a predetermined reference so as to determine a correction for correcting the temperature distribution.

2. A method as claimed in claim 1, wherein the method comprises a further step in which the correction is applied to the MR signals used to reconstruct the phase image in order to correct these signals for a shift of the slice.

3. The method of claim 2, wherein the correction also includes a phase correction of a pixel of the temperature distribution of the part in a first position, said phase correction being determined by a phase difference between a first measuring point of the reference, which corresponds to the first position, and a second measuring point of the navigator signal which corresponds to a second position of the part, said second position having been shifted in the measuring direction relative to the first position.

4. The method of claim 2, wherein a cylindrical part is chosen as the first reference part.

5. The method of claim 2, wherein for the reference a reference navigator signal is generated by means of a second navigator pulse sequence in the first reference part, prior to the measurement of the MR signals for the reconstruction of the predetermined reference image.

6. The method of claim 2, wherein the method includes a step, prior to the generating of the imaging pulse sequences, for further homogenizing the substantially uniform steady magnetic field in the part of the object to be imaged.

7. A method as claimed in claim 2, wherein the measuring direction corresponds to a direction transverse to the slice, a frequency content of an excitation RF pulse of an imaging pulse sequence succeeding the first navigator pulse sequence being corrected for the shift of the slice.

8. A method as claimed in claim 2, wherein the measuring direction corresponds to a direction of a read-out gradient of an imaging pulse sequence for measuring the MR signals, a frequency correction being applied to the MR signals during the measurement of the MR signals, said frequency correction being related to the shift of the slice.

9. A method as claimed in claim 2, wherein the measuring direction corresponds to a direction of a phase encoding gradient of an imaging pulse sequence for measuring the MR signals, a phase correction being applied to the MR signals during the measurement of the MR signals, said phase correction being related to the shift of the slice.

10. A method as claimed in claim 1, wherein the correction also includes a phase correction of a pixel of the temperature distribution of the part in a first position, said phase correction being determined by a phase difference between a first measuring point of the reference, which corresponds to the first position, and a second measuring point of the navigator signal which corresponds to a second position of the part, said second position having been shifted in the measuring direction relative to the first position.

11. A method as claimed in claim 1, wherein a cylindrical part is chosen as the first reference part.

12. A method as claimed in claim 1, wherein for the reference a reference navigator signal is generated by means of a second navigator pulse sequence in the first reference part, prior to the measurement of the MR signals for the reconstruction of the predetermined reference image.

13. A method as claimed in claim 1, wherein the method includes a step, prior to the generating of the imaging pulse sequences, for further homogenizing the substantially uniform steady magnetic field in the part of the object to be imaged.

14. An MR device for measuring a temperature distribution of a part of an object comprising:

means for sustaining a substantially steady magnetic field, means for generating magnetic field gradients, means for generating RF fields, means for receiving and processing the generated MR signals, control means for generating control signals for the means for generating magnetic field gradients and the means for generating RF fields, a processing unit for reconstructing a phase image from the processed MR signals and a temperature distribution from phase differences between values of corresponding pixels of the phase image and a predetermined reference phase image, and means for displaying a temperature distribution, wherein the control means are also arranged to measure, using a navigator pulse sequence, a navigator signal in a reference part of an object arranged in the MR device, a motion of said reference part being related to the part of the object whose temperature distribution is determined, and wherein the processing unit is also arranged to determine a shift in a measuring direction of the navigator pulse sequence from the measured navigator signal and a predetermined reference, and to determine a correction from the shift so as to correct the temperature distribution.

* * * * *